United States Patent
Shouji et al.

(10) Patent No.: US 11,393,657 B2
(45) Date of Patent: Jul. 19, 2022

(54) ELECTRON BEAM DEVICE

(71) Applicant: Hitachi High-Tech Corporation, Tokyo (JP)

(72) Inventors: Minami Shouji, Tokyo (JP); Natsuki Tsuno, Tokyo (JP); Toshihide Agemura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/274,872

(22) PCT Filed: Sep. 11, 2018

(86) PCT No.: PCT/JP2018/033669
§ 371 (c)(1),
(2) Date: Mar. 10, 2021

(87) PCT Pub. No.: WO2020/053967
PCT Pub. Date: Mar. 19, 2020

(65) Prior Publication Data
US 2022/0059317 A1    Feb. 24, 2022

(51) Int. Cl.
*H01J 37/28*    (2006.01)
*H01J 37/22*    (2006.01)
(Continued)

(52) U.S. Cl.
CPC ............ *H01J 37/28* (2013.01); *H01J 37/222* (2013.01); *H01J 37/226* (2013.01);
(Continued)

(58) Field of Classification Search
CPC .. H01J 37/00; H01J 37/02; H01J 37/26; H01J 37/28; H01J 37/222; H01J 37/226; H01J 37/244; H01J 37/265; H01J 2237/24495
(Continued)

(56) References Cited

U.S. PATENT DOCUMENTS

| 6,476,387 B1 | 11/2002 | Nishimura et al. |
| 2003/0094572 A1 | 5/2003 | Matsui et al. |

(Continued)

FOREIGN PATENT DOCUMENTS

| JP | 2000-036273 A | 2/2000 |
| JP | 2003-151483 A | 5/2003 |

OTHER PUBLICATIONS

PCT/JP2018/033669 International Search Report, dated Nov. 13, 2018, 1pg.

*Primary Examiner* — Jason L McCormack
(74) *Attorney, Agent, or Firm* — Volpe Koenig

(57) ABSTRACT

An electron beam device obtains contrast reflecting an electronic state of a sample with high sensitivity. The device includes an electron optical system which emits an electron beam to a sample and detects electrons emitted from the sample; a light pulse emission system that emits a light pulse to the sample; a synchronization processing unit that samples the emitted electrons; an image signal processing unit which forms an image by a detection signal output based upon the emitted electrons detected by the electron optical system; and a device control unit for setting a control condition of the electron optical system. The device control unit sets a sampling frequency for detection sampling of the emitted electrons to be greater than a value obtained by dividing the number of emissions of the light pulse per unit pixel time by the unit pixel time.

15 Claims, 11 Drawing Sheets

(51) Int. Cl.
  *H01J 37/244* (2006.01)
  *H01J 37/26* (2006.01)
(52) U.S. Cl.
  CPC .......... *H01J 37/244* (2013.01); *H01J 37/265* (2013.01); *H01J 2237/24495* (2013.01)
(58) Field of Classification Search
  USPC .......................................... 250/306, 307, 311
  See application file for complete search history.

(56) References Cited

U.S. PATENT DOCUMENTS

2006/0202119 A1* 9/2006 Yamada ............... G01R 31/307
                                                    250/310
2014/0103225 A1* 4/2014 Kieft ..................... H01J 37/045
                                                    250/440.11
2019/0013178 A1* 1/2019 Zachreson .......... H01J 37/1471

\* cited by examiner

A: NUMBER OF LIGHT PULSE EMISSIONS $N_{shot}$ PER UNIT PIXEL TIME $t_{pixel}$
B: LIGHT PULSE EMISSION TIME WIDTH $t_{pulse}$
C: LIGHT PULSE EMISSION FREQUENCY $f_{pulse}$
D: LIGHT PULSE EMISSION INTERVAL TIME $t_i$
E: DETECTION SAMPLING FREQUENCY $f_{samp}^{pixel}$
G: NUMBER OF DETECTION SAMPLING POINTS $N_{samp}$

ELECTRON BEAM DEVICE

TECHNICAL FIELD

The present invention relates to an electron beam device for observing a sample by using an electron beam, and more particularly, to a technology for observing, inspecting, and measuring the sample by an image whose contrast is controlled by emitting light to the sample.

BACKGROUND ART

As a microscope capable of magnifying and observing a sample, there is an electron microscope using an electron beam, and the electron microscope is used for nano-level fine shape observation and composition analysis. Particularly, a scanning electron microscope (hereinafter abbreviated as an SEM) has a feature of being able to perform analysis from low magnification of millimeter order to high magnification of nano order regardless of a sample size, and is widely used for analyzing a shape of a material and composition thereof, and for measurement and inspection of a fine pattern of a semiconductor device.

A performance indicator for an electronic device and an environmental material includes electrical properties, photochemical reaction, and thermal conductivity, and physical properties that determine this performance are electronic properties. In order to improve the performance of these electronic devices and the environmental material, it is important to perform analysis of the electronic properties caused by nano and microscale structures and transient analysis of an electronic state. The electronic properties include an energy band structure, a carrier density, and a bonded state. A transient change in the electronic state includes a change in the energy band structure caused by carrier excitation, carrier life expectancy, and carrier movement.

Photoelectron spectroscopy is a representative method for analyzing the electronic properties. This method is an analysis method using interaction between electrons and light, and can analyze the electronic state such as an internal potential and an energy band structure with high sensitivity and quantitatively. Proposed is a time resolution analysis method of the electronic state by a pump probe spectroscopic method using a pulse laser. However, since these spectroscopic methods are analysis methods using light, it is extremely difficult to perform analysis in a nano region.

On the other hand, the SEM has a high spatial resolution because an electron beam (also referred to as a primary electron) accelerated by a voltage applied to an electron source is focused by an electron lens to several nanometers or less. Next, an emitted electron (a secondary electron and a reflected electron) emitted from the sample by the electron beam focused on the sample is detected by a detector, and an image is formed based upon a detection signal thereof. An emission amount of the secondary electron and the reflected electron depends not only on a shape and composition of the sample, but also on a surface potential and a built-in potential reflecting the electronic state. Contrast of the image depending on the surface potential and the built-in potential is referred to as potential contrast and dopant contrast, respectively.

JP-A-2003-151483 (PTL 1) discloses an inspection device that inspects a position and a type of a defect on a wafer, and proposes a method for inspecting a defect in an electronic device by emitting ultraviolet light and laser light during electron beam emission to generate a pair of electron holes at a junction in the wafer.

CITATION LIST

Patent Literature

PTL 1: JP-A-2003-151483

SUMMARY OF INVENTION

Technical Problem

By emitting light to a sample, a carrier is excited in the sample according to the number of photons, and an electronic state changes. As will be described later, the inventors find out that an emission amount of secondary electrons from the sample changes depending on density of the excited carrier. When the electronic state is changed by the light, the electronic state changes depending on a wavelength, an emission intensity, and an emission time of the light. Therefore, in order to control a light emission condition and to accurately detect a change in the electronic state caused by a predetermined light emission condition, it is found out that even detection sampling for detecting emitted electrons emitted from the sample is required to be controlled.

Solution to Problem

An electron beam device according to one embodiment of the present invention includes: an electron optical system that emits an electron beam to a sample and detects emitted electrons emitted from the sample; a light pulse emission system that emits a light pulse to the sample; a synchronization processing unit configured to perform detection sampling of the emitted electrons in synchronization with a deflection signal of the electron beam in the electron optical system; an image signal processing unit configured to form an image by a detection signal outputted based upon the emitted electrons detected by the electron optical system; and a device control unit configured to set a control condition of the electron optical system, in which when the time required for the electron beam to scan a region of the sample corresponding to one pixel of the image is defined as unit pixel time, the device control unit sets a sampling frequency for performing the detection sampling of the emitted electrons to be greater than a value obtained by dividing the number of emissions of the light pulse per unit pixel time by the unit pixel time.

An electron beam device according to one embodiment of the present invention includes: an electron optical system that emits an electron beam to a sample and detects emitted electrons emitted from the sample; a light pulse emission system that emits a light pulse to the sample; a synchronization control unit configured to perform emission of the light pulse and detection sampling of the emitted electrons in synchronization with a deflection signal of the electron beam in the electron optical system; an image signal processing unit configured to form an image by a detection signal outputted based upon the emitted electrons detected by the electron optical system; and a device control unit configured to set a control condition of the electron optical system and the light pulse emission system, in which the device control unit sets a sampling frequency for performing the detection sampling of the emitted electrons to be equal to an emission frequency of the light pulse, and sets a plurality of interval times between an emission timing of the light pulse and a detection sampling timing of the emitted electrons, and the image signal processing unit emits the light pulse to the sample, and forms a plurality of images by the detection signals outputted based upon the emitted electrons detected by the electron optical system at each of the plurality of interval times set by the device control unit.

Advantageous Effects of Invention

An electronic state changed by light emission can be detected with an electron beam with high sensitivity and quantitatively.

Other problems and new features will be apparent from description of the specification and accompanying drawings thereof.

DESCRIPTION OF EMBODIMENTS

Figure 1:
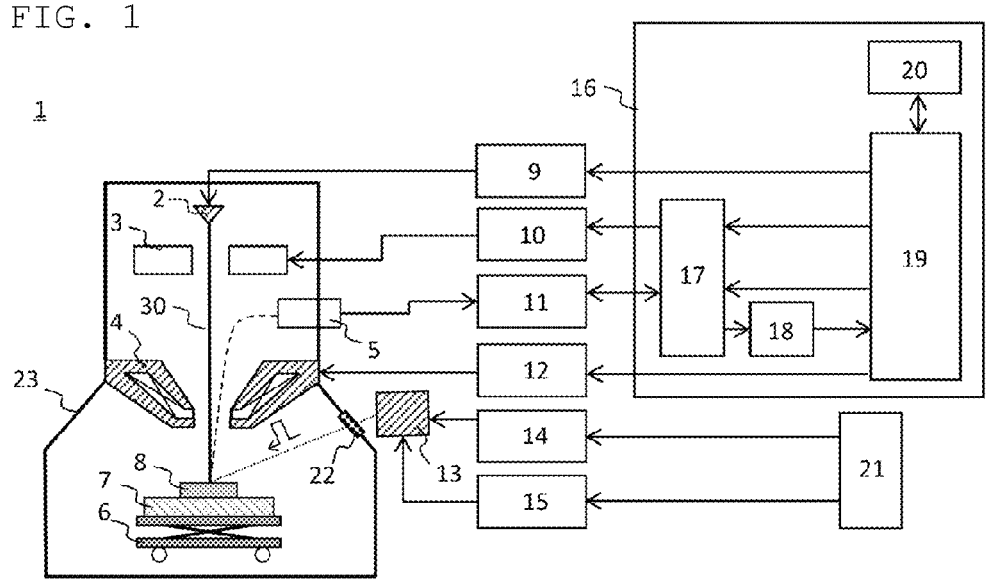
FIG. 1 is a configuration example of an electron beam device.

Hereinafter, embodiments of the present invention will be described with reference to the drawings.

As described above, when a sample is irradiated with light, a carrier is excited in the sample according to the number of photons, and an electronic state changes. The inventors find out that an emission amount of a secondary electron from the sample changes depending on density of the excited carrier.

Energy $E_{ph}$ [J] per photon is represented by (Equation 1).

[Equation 1]

$$E_{ph}=h \cdot c/\lambda \quad \text{(Equation 1)}$$

Here, h is a Planck constant ($6.63 \times 10^{-34}$ [Js]), c is a light speed ($3.00 \times 10^8$ [m/s]), and $\lambda$ is a wavelength of light. When a pulse laser is used for excitation light of the carrier, an energy amount $E_{pulse}$ per light pulse is given by (Equation 2).

[Equation 2]

$$E_{pulse}=W_{ave}/f_{pulse} \quad \text{(Equation 2)}$$

Here, $W_{ave}$ is an average output of the pulse laser, and $f_{pulse}$ is an emission frequency of the pulse laser. Therefore, the number of photons $N^{pulse}_{ph}$ per light pulse is given by (Equation 3).

[Equation 3]

$$N_{ph}^{pulse}=E_{pulse}/E_{ph} \quad \text{(Equation 3)}$$

On the other hand, carrier density $D^{pixel}_{carrier}$ excited per unit pixel time when the electron beam is emitted is represented by (Equation 4).

[Equation 4]

$$D_{carrier}^{pixel} = \alpha(\lambda) \cdot N_{ph}^{pulse} \cdot e^{-\frac{t_i}{\tau}} \cdot N_{shot}/S \quad \text{(Equation 4)}$$

Here, $\alpha(\lambda)$ is generation efficiency of the carrier, $t_1$ is interval time between light pulse emissions, $\tau$ is carrier life expectancy, $N_{shot}$ is the number of light pulse emissions emitted per unit pixel time, and S is an emission area of the pulse laser. The carrier generation efficiency $\alpha(\lambda)$ takes a different value depending on a material.

In consideration of interaction with the secondary electron, an emission amount of the secondary electron emitted per unit pixel $SE^{pixel}_{elec}$ is represented by (Equation 5).

[Equation 5]

$$SE_{elec}^{pixel}=\beta(E_{PE}) \cdot \sigma \cdot I_p \cdot t_{pixel} \cdot D_{carrier}^{pixel} \quad \text{(Equation 5)}$$

Here, $\beta(E)$ is an interaction coefficient with the secondary electron, and is a value that depends on an acceleration voltage of the electron beam $E_{PE}$. $\sigma$ is a secondary electron emission rate, $I_p$ is an emission current of the electron beam, and $t_{pixel}$ is the unit pixel time. The unit pixel time $t_{pixel}$ is defined as the time required for the electron beam to scan a region of the sample corresponding to one pixel of an SEM image.

As described above, the carrier density $D^{pixel}_{carrier}$ excited by the emission of the pulse laser varies depending on the material, and further, the emission amount of the secondary electron $SE^{pixel}_{elec}$ emitted by the emission of the electron beam changes depending on the carrier density $D^{pixel}_{carrier}$. Therefore, a difference in a change in the electronic state caused by the light emission in accordance with the material is detected with high sensitivity and quantitatively with the electron beam, thereby making it possible to visualize the difference in the material as image contrast. In order to achieve what is described above, it is important to control detection sampling that grasps a change in the number of photons interacting with the electron beam per unit time and the emission amount of the secondary electron under photoexcitation. A suitable detection sampling frequency $f^{pixel}_{samp}$ for grasping the change in the emission amount of the secondary electron under the photoexcitation is given by (Equation 6).

[Equation 6]

$$f_{samp}^{pixel}>N_{shot}/t_{pixel} \quad \text{(Equation 6)}$$

Here, $N_{shot}$ is the number of light pulse emissions per unit pixel time $t_{pixel}$.

The carrier density $D^{Pixel}_{carrier}$ shown as (Equation 4) includes the carrier life expectancy τ. By analyzing the emission amount of the secondary electron $SE^{pixel}_{elec}(t_i)$ in which the interval time $t_i$ between the light pulse emissions is defined as a control variable, a transient characteristic of the electronic state can be analyzed.

First Embodiment

A first embodiment describes an electron beam device that can control the emission amount of the secondary electron from a sample by electron beam emission by controlling the emission of intermittently emitted light pulse, and that can acquire a high contrast image.

FIG. 1 illustrates a configuration example of an electron beam device of a first embodiment. An electron beam device 1 includes, as a main configuration thereof, an electron optical system, a stage mechanism system, an electron beam control system, a light pulse emission system, an image processing system, and an input and output system. The electron optical system includes an electron gun 2, a deflector 3, an electron lens 4, and a detector 5. The stage mechanism system includes an XYZ stage 6 and a sample holder 7 on which a sample 8 is placed. The electron beam control system includes an electron gun control unit 9, a deflector control unit 10, a detection control unit 11, and an electron lens control unit 12. The light pulse emission system includes a pulse light source 13, a light pulse control unit 14, a light pulse emission adjustment unit 15, and a light pulse emission setting unit 21. A main console 16 includes an image forming system and an input and output system. The image forming system includes a synchronization processing unit 17 having a detection sampling function synchronized with a deflection signal that controls the deflector 3, and an image signal processing unit 18. The image signal processing unit 18 forms an SEM image from the detection signal outputted when the detector 5 detects emitted electrons. The input and output system includes a device control unit 19 for setting a control condition and an image display unit 20.

An electron beam 30 emitted from the electron gun 2 is focused by the electron lens 4, and then emitted to the sample 8. An emission position on the sample is controlled by the deflector 3. Emitted electrons emitted from the sample are detected by the detector 5. The device control unit 19 sets the control conditions of the electron optical system such as, specifically, an acceleration voltage, an emission current, a deflection condition, a detection sampling condition, and an electron lens condition.

The light pulse is emitted from the pulse light source 13. As the pulse light source 13, a laser that is driven at a pulse width of 1 μsec or less and an emission clock of 1 kHz or more, and that can output a single wavelength or multiple wavelengths in a region where an output wavelength is from an ultraviolet ray to a near infrared ray is used. The pulse light source 13 is controlled by the light pulse control unit 14 and the light pulse emission adjustment unit 15, and a control content thereof is set by the light pulse emission setting unit 21. Specifically, the light pulse control unit 14 controls a light pulse emission time width and light pulse emission interval time. As the light pulse emission interval time, a light pulse emission frequency or the number of light pulse emissions per unit time may be controlled. The light pulse emission adjustment unit 15 adjusts the intensity and wavelength of the light pulse to be emitted.

Figure 2:
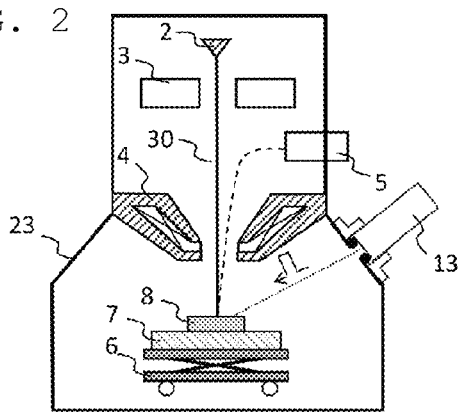
FIG. 2 is a modification of a housing of the electron beam device.

The light outputted from the pulse light source 13 is emitted to the sample 8 placed in a vacuum space of a housing 23 via a port 22 installed in the housing 23. Although not illustrated in the drawing, an adjustment mirror of an optical path for being able to irradiate the same position as the electron beam may be installed outside the housing 23 (an atmospheric pressure space). As illustrated in FIG. 2, the pulse light source 13 may be configured to be installed directly on the housing 23. Generally, the port 22 is formed of quartz glass. Therefore, it becomes difficult to emit the light in a wavelength region absorbed by the quartz glass. By directly installing the pulse light source 13 on the housing 23, restriction on the wavelength of the light to be emitted can be eliminated.

Figure 3:
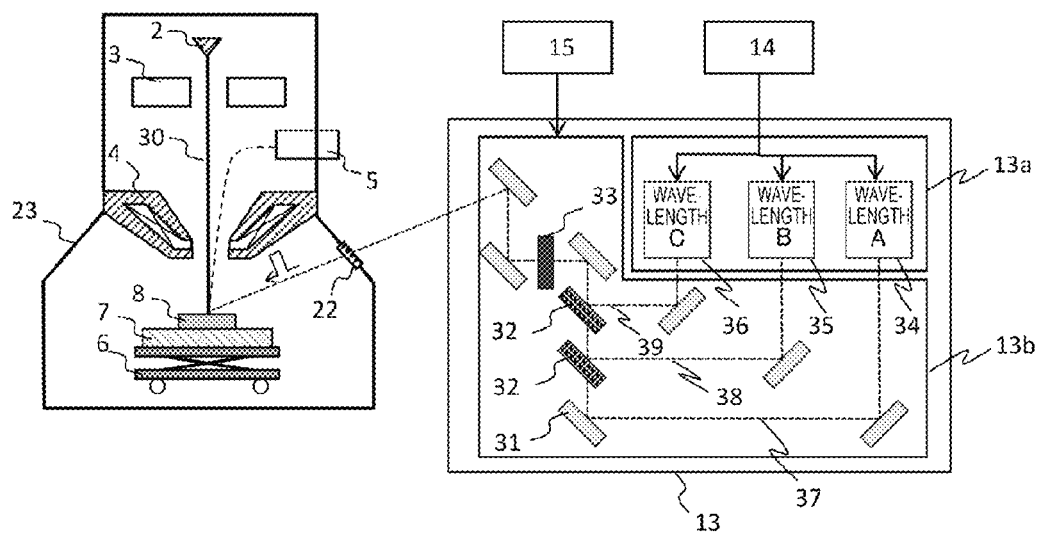
FIG. 3 is a diagram illustrating a method for adjusting an intensity and a wavelength of a light pulse.

A method of adjusting the intensity and wavelength of the light pulse emitted from the pulse light source 13 by the light pulse control unit 14 and the light pulse emission adjustment unit 15 will be described with reference to FIG. 3. The pulse light source 13 includes a light source unit 13a and an optical path switching unit 13b. The light source unit 13a includes a light source 34, a light source 35, and a light source 36 that emit light pulses respectively having different wavelengths, and the light pulse control unit 14 selects a light source having a desired wavelength. The optical path switching unit 13b forms an optical path 37, an optical path 38, and an optical path 39 of the light pulses from the light source 34, the light source 35, and the light source 36 by an adjustment mirror 31, and one of the optical paths is selected by the light pulse emission adjustment unit 15. Specifically, in the example, by using a flipper mirror 32 whose installation angle can be changed in a part of the optical path 38 and the optical path 39, a light pulse from a self-light source is reflected at a predetermined installation angle to form a self-light path, and the installation angle is changed for a light pulse from another light source so as not to interfere with the optical path. The optical path 37, the optical path 38, and the optical path 39 share a part of the optical path, and a light amount variable filter 33 is installed on the shared optical path portion. The light pulse emission adjustment unit 15 adjusts the intensity of the light pulse emitted by the light amount variable filter 33. A configuration of FIG. 3 is an example, and a laser capable of oscillating at multiple wavelengths may be used and selected by an optical filter. In order to adjust the intensity of the light pulse, a condenser lens may be installed in the optical path, thereby varying the intensity density of the light pulse.

Figure 4:
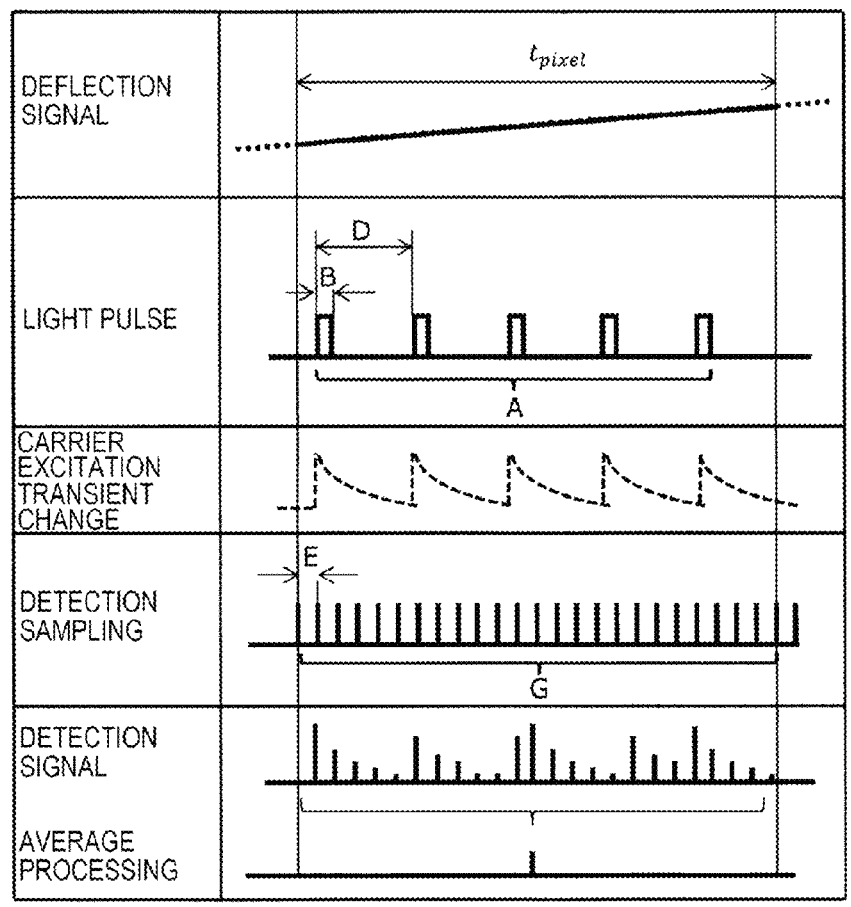
FIG. 4 is an example of a control time chart of a first embodiment.

FIG. 4 illustrates a time chart of a deflection signal (an output of the deflector control unit 10), a light pulse (an output of the pulse light source 13), and detection sampling control (control of the detection control unit 11 by the synchronization processing unit 17). Control signals at these operation start points are not illustrated in FIG. 4, but are controlled in synchronization with a system clock. With a specified pulse width $t_{pulse}$, the light pulses of $N_{shot}$ times per unit pixel time $t_{pixel}$ are emitted. At this time, an emission frequency of the light pulse is $f_{pulse}$. Light pulse emission interval time when the emission frequency of the light pulse is $f_{pulse}$ is $t_i$, and either of them may be controlled. As described above, a signal increase of the emitted electrons by the light pulse is given by (Equation 5), and it is necessary to perform detection sampling control in accordance with a transient change as shown in (Equation 6). In the time chart of FIG. 4, this detection sampling control is controlled by the detection sampling frequency $f^{pixel}_{samp}$ or the number of detection sampling points $N_{samp}$ per unit pixel time $t_{pixel}$. By controlling the detection sampling frequency $f^{pixel}_{samp}$ at a frequency sufficiently higher than the emission frequency of the light pulse $f_{pulse}$, it is possible to detect a change in the emission amount of the emitted electrons by the light pulse. The detection signals detected by the set $f^{pixel}_{samp}$ are averaged for each pixel, and then transmitted to the image signal processing unit 18.

Figure 5:
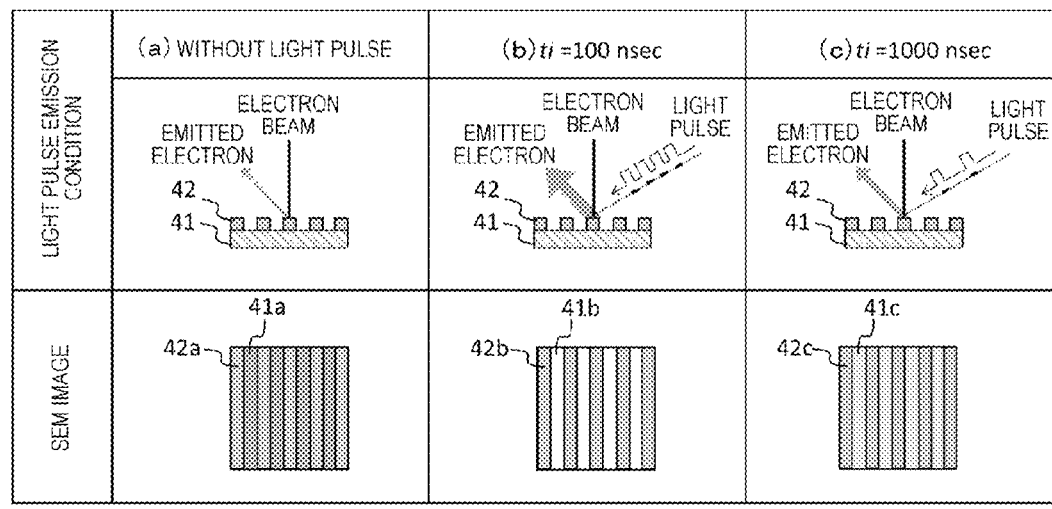
FIG. 5 is a diagram illustrating an SEM image (a schematic diagram) for each light pulse emission condition in the first embodiment.

FIG. 5 illustrates an SEM image (schematic diagram) in which a change in the emission amount of emitted electrons is detected by changing a light pulse emission condition (light pulse emission interval time $t_i$) by the electron beam device of the first embodiment. A sample is obtained by applying a resist 42 on an antireflection film 41 to form a line pattern. Electron beam conditions are common at an acceleration voltage of 0.5 kV, an emission current of 10 pA, and a scanning speed of a TV rate, and the light pulse emission conditions are set as follows: (a) no light pulse emission, (b) the light pulse emission interval time $t_i$=100 ns, and (c) the light pulse emission interval time $t_i$=1000 ns. The detection sampling frequency $f^{pixel}_{samp}$ is also common at 10 GHz. Here, the wavelength of the used light pulse is 375 nm, and the light pulse is not absorbed by the resist 42 and is absorbed by the antireflection film 41. As a result, while the SEM image does not significantly change with respect to a resist unit 42a, a resist unit 42b, and a resist unit 42c in any case, by irradiating an antireflection film unit 41b and an antireflection film unit 41c with the light pulse, the antireflection film unit 41b and the antireflection film unit 41c become brighter than an antireflection film unit 41a, such that higher contrast can be obtained. When an emission condition (b) and an emission condition (c) are compared with each other, under the emission condition (b) in which the light pulse emission interval time $t_i$ is short, an average value of the detection signals becomes higher, whereby an image having higher contrast can be obtained.

As described above, a predetermined wavelength in accordance with a material is selected as the wavelength of the light pulse, and the light pulse emission interval time and the detection sampling frequency are controlled, thereby making it possible to change the emission amount of emitted electrons in a material-selective manner by the light pulse emission, and to improve the SEM contrast.

Second Embodiment

A second embodiment describes an electron beam device in which a difference signal or a difference image is formed from a difference value of detection signals by emitted electrons detected at two or more different light pulse emission interval times $t_i$, and a feature amount of a sample is extracted from the difference signal or the difference image such that highly sensitive defect detection can be performed. The electron beam device of the second embodiment is the same as that of FIG. 1.

Figure 6:
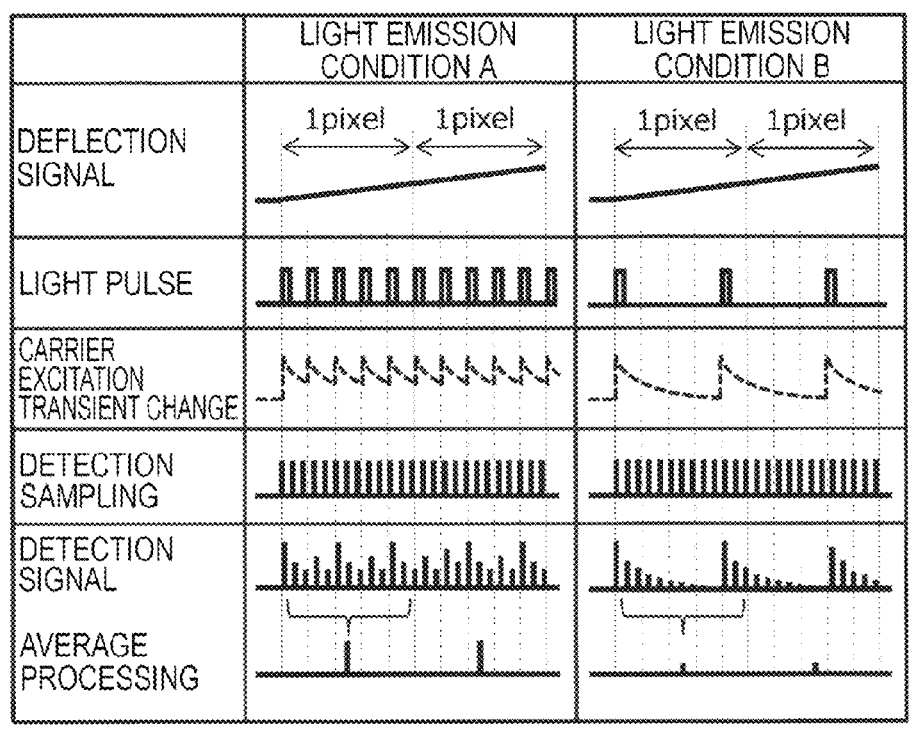
FIG. 6 is an example of a control time chart of a second embodiment.

FIG. 6 illustrates a time chart of a deflection signal (an output of the deflector control unit 10), a light pulse (an output of the pulse light source 13), and detection sampling control (control of the detection control unit 11 by the synchronization processing unit 17). Control signals at these operation start points are not illustrated in FIG. 6, but are controlled in synchronization with a system clock. When detection under different light pulse emission conditions (light emission conditions A and B in FIG. 6) set by the light pulse emission setting unit 21 is completed, the image signal processing unit 18 calculates a difference between detection signals of emitted electrons under the different light pulse emission conditions, and two-dimensionally displays the difference therebetween to form a difference image. Alternatively, SEM images may be formed for the respectively different light pulse emission conditions, and difference processing may be performed between the SEM images.

Figure 7:
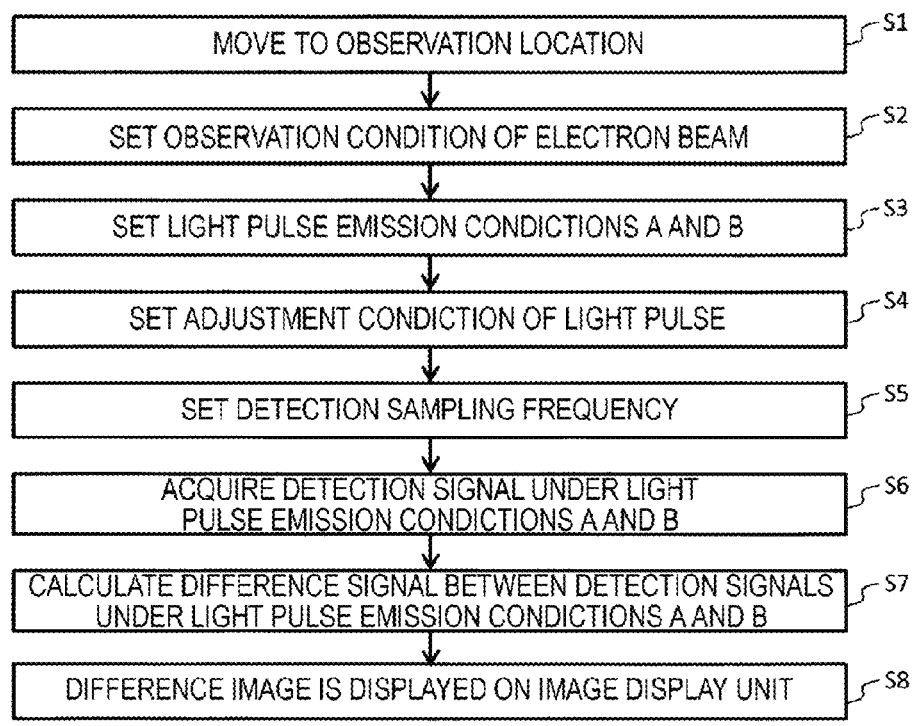
FIG. 7 is an example of a flowchart for acquiring a difference image.

FIG. 7 illustrates an acquisition flow of the difference image. First step is to move to an observation location of a sample by the stage mechanism system (S1). An acceleration voltage of the electron beam, an emission current, and scanning time, which are basic observation conditions, are set (S2). Next, emission conditions A and B of the light pulse to be emitted to the sample (specifically, the emission frequency of the light pulse $f_{pulse}$) are set (S3). Of course, it is allowed to set two or more emission conditions. Next, adjustment conditions for the light pulse (specifically, the wavelength and intensity of the light pulse) are set (S4). Next, the detection sampling frequency $f^{pixel}_{samp}$ is set (S5). At this time, the detection sampling frequency $f^{pixel}_{samp}$ is required to satisfy the condition indicated as (Equation 6) with respect to any one of the light pulse emission conditions. Continuously, the sample is observed while emitting the light pulse at the emission frequency of the light pulse $f_{pulse}$ set under the light pulse emission conditions A and B, and a detection signal is acquired (S6). A difference signal between the detection signal under the light pulse emission condition A and the detection signal under the light pulse emission condition B is calculated (S7), and an image is formed based upon a calculated difference value of the detection signal and the image is displayed on the image display unit 20 (S8).

Figure 8:
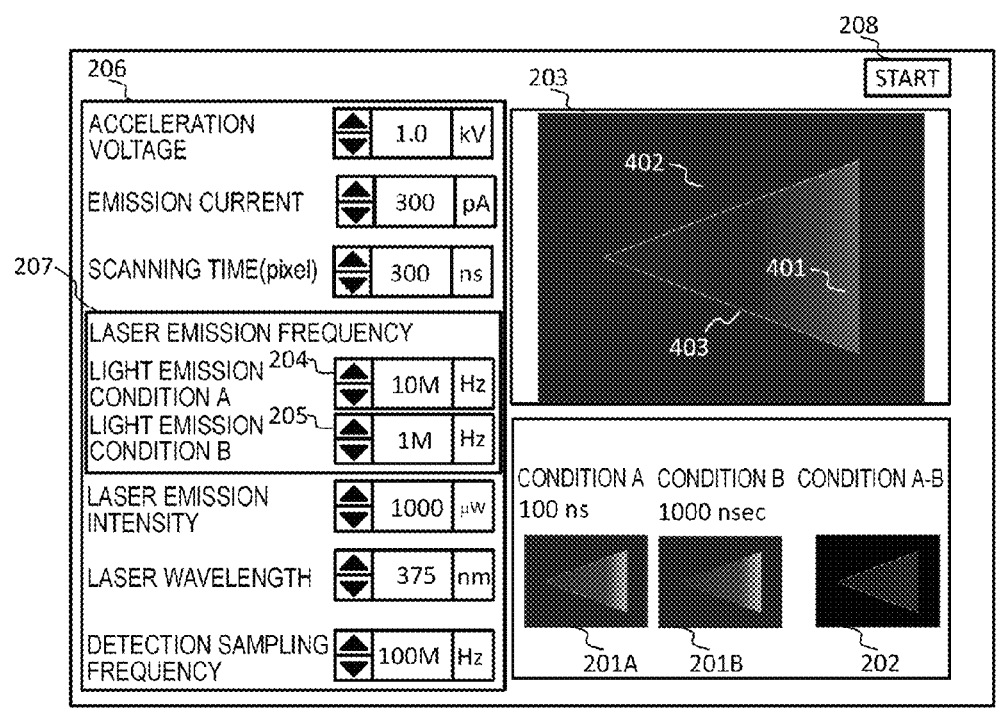
FIG. 8 is an example of a GUI of the second embodiment.

FIG. 8 illustrates an example of a GUI displayed on the image display unit 20. In the electron beam device of FIG. 1, the control content of the light pulse emission setting unit 21 can be set from the device control unit 19, whereby an SEM image acquisition condition setting unit 206 can set an emission wavelength of the light pulse, an emission intensity of the light pulse, and a detection sampling cycle, in addition to the acceleration voltage of the electron beam, the emission current, and the scanning speed which are the basic observation conditions. In the GUI, a light pulse emission condition setting unit 207 can set emission frequencies (204 and 205) of a plurality of light pulses $f_{pulse}$. An SEM image set by the SEM image acquisition condition setting unit 206 is displayed on a display unit 201A and a display unit 201B for each condition of the emission frequencies of the plurality of light pulses $f_{pulse}$, and a difference image is displayed on a difference image display unit 202. An SEM image under a current observation condition is displayed on an observation state display unit 203.

In this example, the observation state display unit 203 displays an SEM image (schematic diagram) of a crystal defect portion of SiC being observed by the electron beam device 1. For example, the acceleration voltage of the electron beam is set to 1.0 kV, the emission current is set to 300 pA, the scanning time per unit pixel is set to 300 ns, the wavelength of the light pulse is set to 375 nm, and the emission intensity of the light pulse is set to 1000 μW. The emission frequency of the light pulse $f_{pulse}$ under the light emission condition A is set to 10 MHz, and the emission frequency of the light pulse $f_{pulse}$ under the light emission condition B is set to 1 MHz. The detection sampling frequency is set to 100 MHz. A desired field of view is set by the observation state display unit 203, and the image is acquired by pressing a start button 208.

As illustrated in the observation state display unit 203, the sample includes a crystal defect portion 401 and a normal portion 402. The crystal defects in this example are stacked defects and have a triangular region. In the case of the light emission condition A, an amount of emitted electrons at an interface 403 between the crystal defect portion 401 and the normal portion 402 increases and the interface 403 becomes brightened, but in the case of the light emission condition B where the emission frequency of the light pulse is low, the contrast of the crystal defect interface 403 is lowered as compared with an emitted electron image acquired under the light emission condition A. Therefore, the interface 403 is extracted from the difference image obtained under the light emission condition A and the light emission condition B. A region that traps a light carrier, such as the interface of the stacked defect, is a location that can become a defect in electronic device application. As described above, according to the embodiment, it is possible to detect the feature amount extraction of the defect with high sensitivity from the difference image of the emitted electrons acquired under the emission conditions of two or more different light pulses. As an application example, an example of extracting the crystal defect interface from the difference image is shown, and it is also possible to extract a difference in materials as shown in the first embodiment.

Third Embodiment

A third embodiment describes a time resolution observation method that synchronizes the emission of the light pulse and the detection sampling of emitted electrons, and that controls an interval time $t_{i(det)}$ between a light pulse emission timing and a detection sampling timing.

Figure 9:
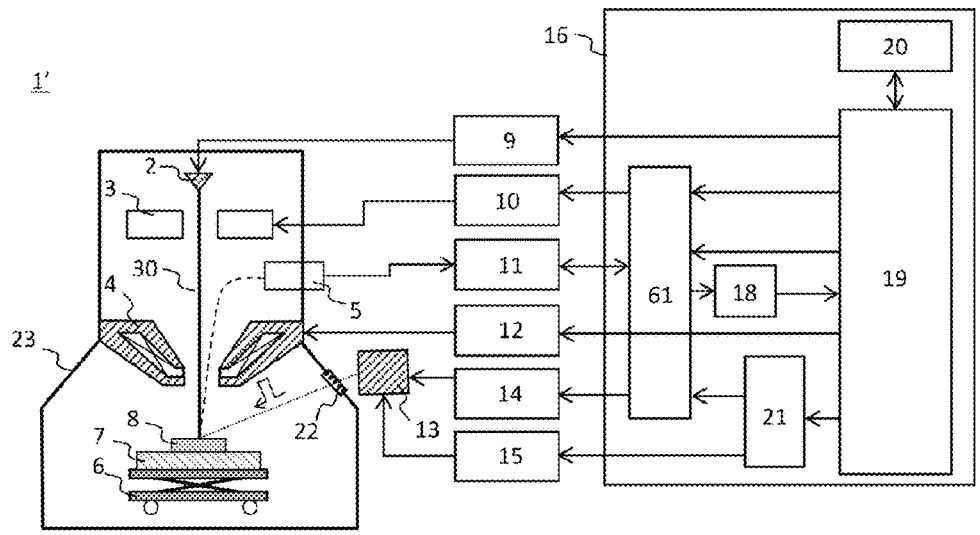
FIG. 9 is a configuration example of an electron beam device.

FIG. 9 illustrates an electron beam device that executes the time resolution observation method. A configuration and a functional block having the same function as those in FIG. 1 will be denoted by the same reference sign, and duplicate description will be omitted. In the electron beam device of the third embodiment, the light pulse emission system can also be controlled by the main console 16, and the control content of the light pulse emission setting unit 21 can be set by the device control unit 19. An electron beam device 1' includes a synchronization control unit 61 that synchronously controls the emission of the light pulse in addition to synchronizing the deflection signal of the electron beam with the detection sampling of emitted electrons. The synchronization control unit 61 can synchronize the light pulse emission timing with the detection sampling timing of emitted electrons, and can control the interval time $t_{i(det)}$ between the light pulse emission timing and the detection sampling timing thereof. The synchronization control unit 61 transmits a timing signal to the deflector control unit 10, the detection control unit 11, and the light pulse control unit 14.

Figure 10:
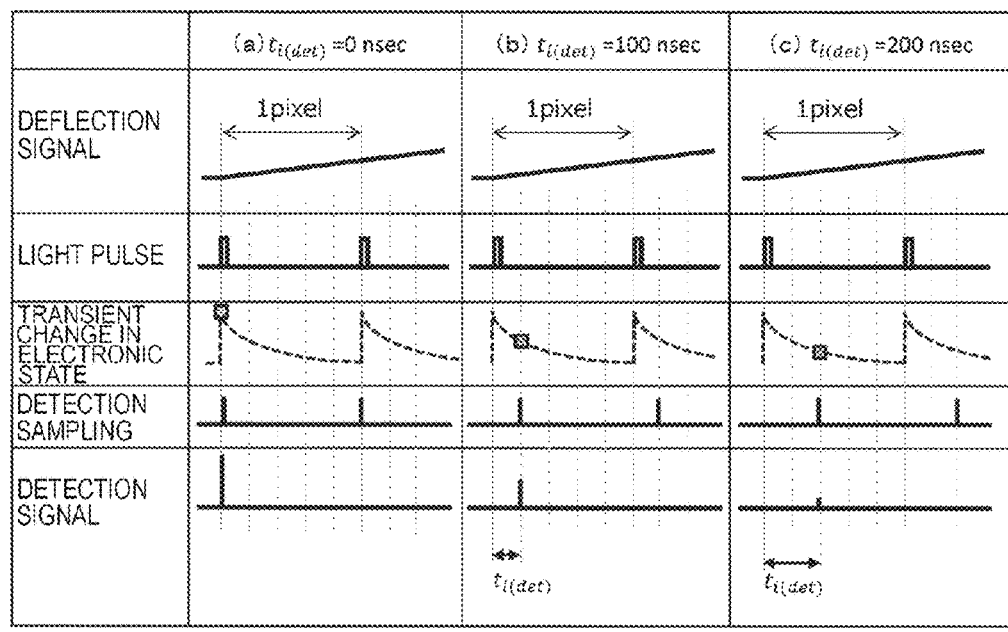
FIG. 10 is an example of a control time chart of a third embodiment.

FIG. 10 illustrates a time chart of a deflection signal (an output of the deflector control unit 10), a light pulse (an output of the pulse light source 13), and detection sampling control (control of the detection control unit 11 by the synchronization control unit 61). When the interval time $t_{i(det)}$ is 0 ns, the detection sampling is triggered at the same timing as that of oscillation of the light pulse. In this example, the number of detection sampling points per unit pixel time $t_{pixel}$ is one point, but sampling may be performed a plurality of times. In the embodiment, the light pulse emission frequency $f_{pulse}$ can be set, and the detection sampling frequency $f^{pixel}_{samp}$ is configured to be set ($f^{pixel}_{samp} = f_{pulse}$) according thereto. The interval time $t_{i(det)}$ is set to be shorter than the detection sampling cycle. As a result, the detection sampling is performed after the set interval time $t_{i(det)}$ from the emission of the light pulse, and the detection signal can be obtained.

These detection signals are imaged by using position information based upon the deflection signal, and an SEM image is formed for each interval time $t_{i(det)}$. The SEM image at the different interval time $t_{i(det)}$ is acquired, thereby making it possible to obtain a series of transient change images. As described above, the synchronization control unit 61 may obtain a series of transient change images by setting the different interval time $t_{i(det)}$ for each SEM image, and by performing the sampling once with respect to one light pulse emission. Alternatively, the synchronization control unit 61 may simultaneously generate a series of transient change images by performing the sampling with the different interval time $t_{i(det)}$ a plurality of times with respect to one light pulse emission.

Figure 11:
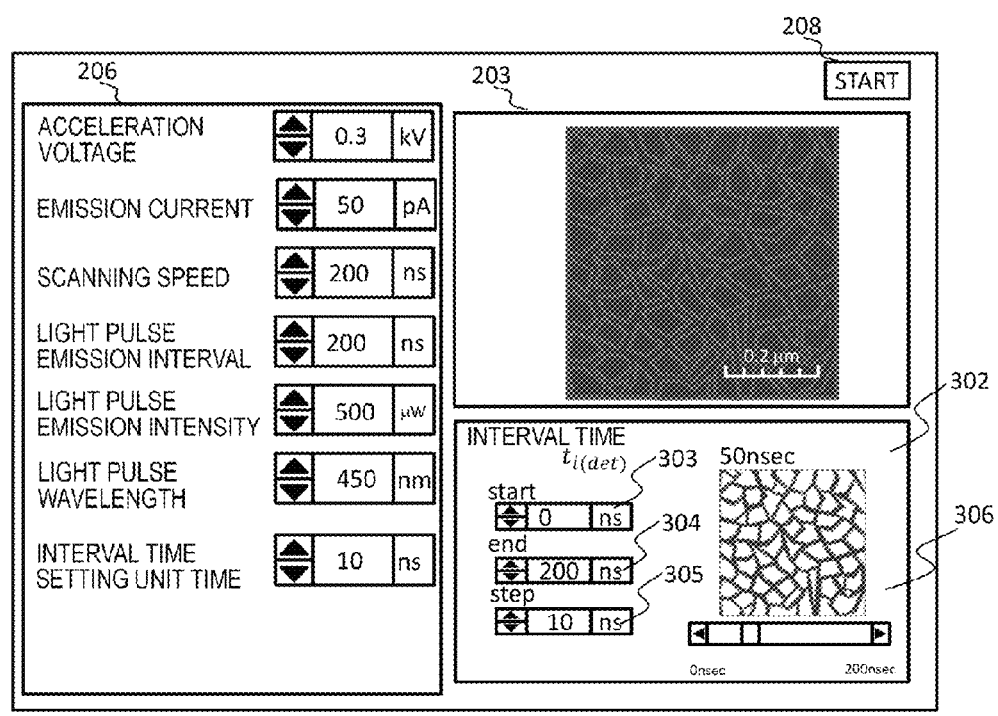
FIG. 11 is an example of a GUI of the third embodiment.

FIG. 11 illustrates an example of the GUI displayed on the image display unit 20. The SEM image acquisition condition setting unit 206 can set a light pulse emission interval time $t_i$ and a light pulse emission intensity as the light pulse emission conditions, in addition to the acceleration voltage of the electron beam, the emission current, and the scanning speed which are the basic observation conditions. As a control condition of the detection sampling, setting unit time of the interval time $t_{i(det)}$ can be set. In the example of FIG. 11, the interval time $t_{i(det)}$ can be set in units of 10 ns. Since the detection sampling frequency $f^{pixel}_{samp}$ is the same as the light pulse emission frequency $f_{pulse}$, a setting screen for the detection sampling frequency or the detection sampling cycle is not provided.

A start time 303 of time resolution, an end time 304 thereof, and a time step 305 thereof can be set in a transient analysis condition setting unit 302. The start time 303 and the end time 304 are set based upon an oscillation timing of the light pulse, and in the time step 305, a value that is an integral multiple of the setting unit time of the interval time $t_{i(det)}$ set by the SEM image acquisition condition setting unit 206 can be set.

Based upon the setting value in the transient analysis condition setting unit 302, the interval time $t_{i(det)}$ is controlled from the start time 303 to the end time 304 with the time step 305 (that is, in the example of FIG. 11, the interval time $t_{i(det)}$=0, 10, 20, . . . 190, 200 nsec), and the SEM image is acquired for each interval time $t_{i(det)}$. The acquired SEM images are combined as a series of transient change images, and the transient change can be confirmed on a toolbar type display unit 306. The interval time $t_{i(det)}$ of the SEM image displayed on the display unit 306 can be changed by moving a slider on a toolbar. A designation unit for designating the interval time $t_{i(det)}$ of the SEM image to be displayed is not limited to a form of the toolbar.

An image (schematic diagram) being observed by the electron beam device 1' is displayed on the observation state display unit 203, a desired field of view is set on the observation state display unit 203, and the image is acquired by pressing the start button 208.

Figure 12:
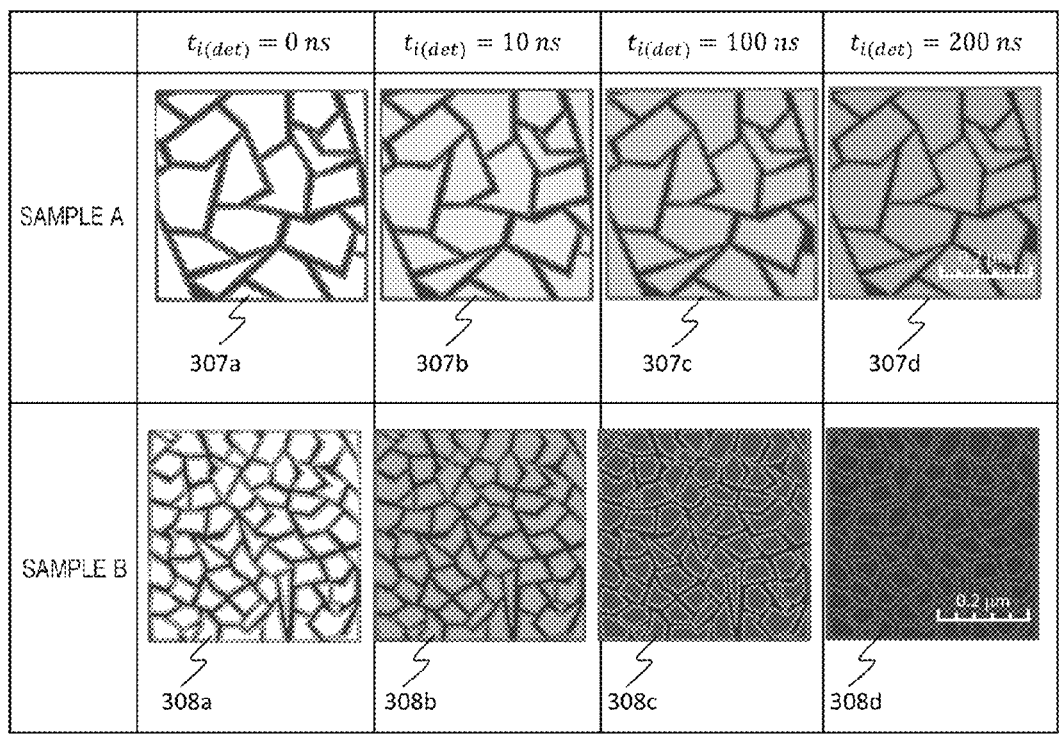
FIG. 12 is a diagram illustrating a transient change image (SEM image (a schematic diagram)) by a time resolution observation method of the third embodiment.

FIG. 12 illustrates an SEM image (schematic diagram) of a transient change in titanium oxide crystal analyzed by the time resolution observation method of the embodiment. The acceleration voltage of the electron beam is set to 0.3 kV, the emission current is set to 50 pA, the scanning speed is set to 200 ns, the emission interval time $t_i$ of the light pulse is set to 200 ns, the emission wavelength of the light pulse is set to 450 nm, and the emission intensity of the light pulse is set to 500 μW. The setting unit time of the interval time $t_{i(det)}$ is set to 10 ns, and the start time of the time resolution is set to 0 ns, the end time thereof is set to 200 ns, and the time step thereof is set to 10 ns. FIG. 12 illustrates the SEM image with the interval time $t_{i(det)}$=0, 10, 100, and 200 ns, and a crystal grain of a sample A is several hundred nm in size, and a crystal grain of a sample B is several tens of nm in size.

By emitting the light pulse, the crystal grains of both the samples A and B become bright, and carriers are generated in crystal grain regions (307a and 308a). When the interval time $t_{i(det)}$ is set to 200 ns, brightness 307d of the crystal grain of the sample A does not almost change as compared with a case in which the interval time $t_{i(det)}$ is set to 0 ns and 100 ns, whereas a crystal grain 308d of the sample B becomes dark. That is, from this result, it can be seen that the sample A and the sample B have the same carrier generation capability, the life expectancy of the carrier becomes shorter as a size of the crystal grain becomes smaller, and a so-called mesoscale structure in which the crystal grain is several hundred nm contributes to the control of the electronic state. For example, in a highly efficient photocatalytic device material, it is required to extend the carrier life expectancy of the electronic state of the material. Nanoscale and microscale structural analysis and excitation carrier transient analysis are effective for searching for the above-described material.

According to the embodiment, the interval time $t_{i(det)}$ between the light pulse emission timing and the detection sampling timing can be controlled, and the transient change image of the electronic state and the excitation carrier can be acquired by the SEM image in which the interval time $t_{i(det)}$ is changed.

Fourth Embodiment

A fourth embodiment describes an electron beam device in which the detection signal is acquired by changing the light pulse emission interval time $t_i$ (reciprocal of the light pulse emission frequency $f_{pulse}$) and the detection signal obtained at each emission interval time $t_1$ is plotted to calculate a time constant of a sample. A configuration of the electron beam device of the embodiment is the same as that of the first embodiment or the second embodiment, and the time chart of the deflection signal, the light pulse, and the detection sampling control is also the same as that of FIG. 6.

Figure 13:
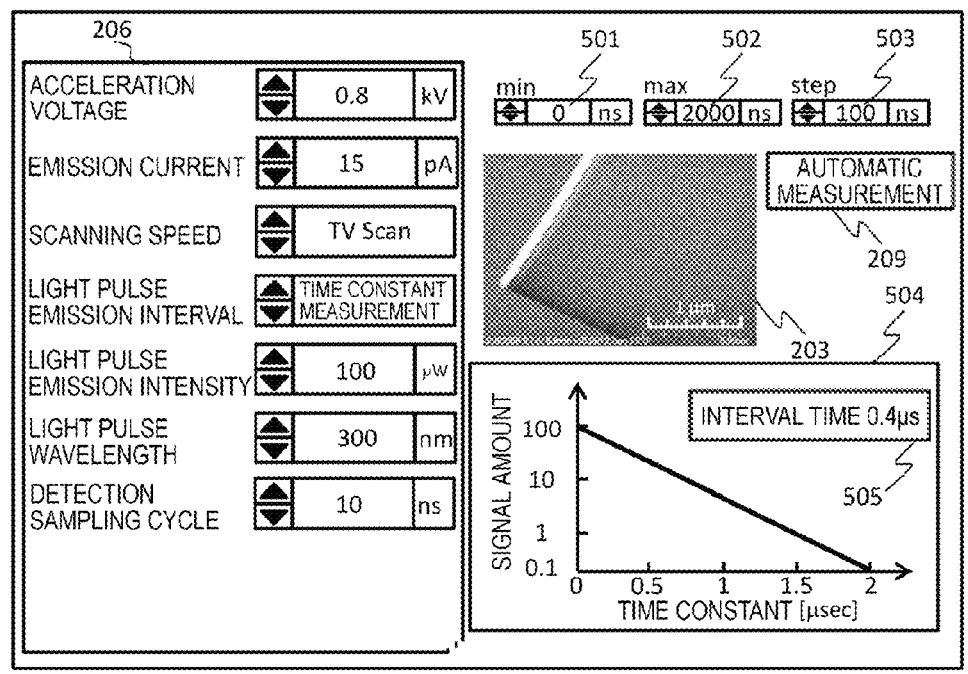
FIG. 13 is an example of a GUI of a fourth embodiment.

FIG. 13 illustrates an example of the GUI displayed on the image display unit 20. The SEM image acquisition condition setting unit 206 can set the emission wavelength of the light pulse and the emission intensity of the light pulse, in addition to the acceleration voltage of the electron beam, the emission current, and the scanning speed which are the basic observation conditions. The detection sampling cycle can be set as a control condition of the detection sampling.

In the embodiment, a transient process of the sample is automatically measured for time constant measurement. Specifically, in order to analyze a transient process of the electronic state due to the light pulse emission, dependence of the light pulse emission interval time $t_i$ of the emission amount of emitted electrons by the light pulse emission is acquired. Therefore, the light pulse emission interval time $t_i$ is set. A detection time range of the transient process is set with a shortest time 501 and a longest time 502. Based upon setting values thereof, the light pulse emission interval time $t_i$ is changed from the shortest time 501 to the longest time 502. A time interval step 503 during this time can be set. Based on the setting values thereof, the light pulse emission interval time $t_i$ is controlled from the shortest time 501 to the longest time 502 with the time interval step 503 (that is, in the example of FIG. 13, the light pulse emission interval time $t_i$=0, 100, 200, . . . 1900, 2000 nsec), and deflection signal control, light pulse emission, and detection sampling control are performed at a timing generated by the synchronization control unit 61. A detection signal amount acquired at each light pulse emission interval time $t_i$ is plotted on a time constant graph display unit 504. Specifically, an SEM image is acquired from a signal acquired for each light pulse emission interval time $t_i$, and the detection signal amount is plotted from a change in SEM image brightness. Alternatively, one or a plurality of points on the sample can be designated, thereby making it possible to obtain the detection signal amount at the designated point. A detection signal acquisition flowchart of steps S1 to S6 of the flowchart of FIG. 7 is applied to a flow of acquiring the dependence of the light pulse emission interval time $t_i$ of the emission amount of emitted electrons by this light pulse emission (however, the light pulse emission conditions A and B are replaced with each light pulse emission interval time $t_i$).

Since the light pulse emission interval time $t_i$ when the signal amount of emitted electrons detected at each light pulse emission interval time $t_i$ is 68% lower than the maximum detection signal amount is the time constant of the sample, the device control unit 19 obtains the time constant of the sample from the time constant graph and displays the obtained time constant on a time constant display unit 505. The time constant measurement starts by pressing an automatic measurement button 209, and the SEM image under the current observation condition is displayed on the observation state display unit 203.

Figure 14:
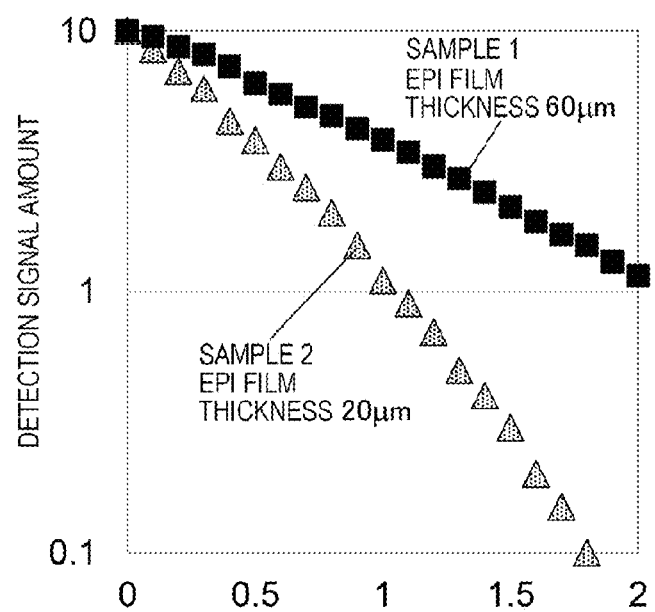
FIG. 14 is a time constant measurement result of a SiC substrate.

FIG. 14 illustrates a time constant measurement result with respect to SiC substrates having different SiC epi film thicknesses analyzed by using the embodiment. Two types of SiC substrates having different epi film thicknesses are used as samples, and a sample 1 has an epi film thickness of 60 μm and a sample 2 has an epi film thickness of 20 μm. The observation conditions are set as follows: the acceleration voltage of the electron beam is set to 0.8 kV, the emission current is set to 15 pA, the scanning speed is set to TV Scan, the light pulse emission intensity is set to 100 μW, the light pulse wavelength is set to 300 nm, and the detection sampling cycle is set to 10 ns. The light pulse emission interval time $t_i$ for the time constant measurement is set to 0 ns for the shortest time, 2000 ns for the longest time, and 100 ns for the time interval step. As illustrated in FIG. 14, the time constant of the sample 1 having the epi film thickness of 60 μm is 1.0 μs, whereas the time constant of the sample 2 having the epi film thickness of 20 μm is 0.5 μs. As described above, it can be seen that the time constant changes depending on a difference in the epi film thickness.

According to the embodiment, the emitted electrons acquired under a plurality of light pulse emission conditions having different light pulse emission interval time $t_i$ are plotted by each pulse emission interval time $t_i$, whereby the time constant measurement reflecting a sample structure can be performed.

Fifth Embodiment

A fifth embodiment describes a highly sensitivity defect detection inspection method that detects emitted electrons emitted when light pulses having different wavelengths are emitted, acquires a difference between detection signals at the respective wavelengths, and extracts a feature amount of a sample from a difference image formed by a difference value. A basic configuration of an electron beam device that executes the highly sensitivity defect detection inspection method is the same as that of the first, second, or fourth embodiment, and the time chart of the deflection signal, the light pulse, and the detection sampling control is also the same as that of FIG. 4. A wavelength to be emitted is controlled by the light pulse emission adjustment unit 15.

The detection signals at the respective wavelengths are transmitted to the image signal processing unit 18, and the image signal processing unit 18 calculates a detection signal difference of the emitted electrons under respective wavelength conditions and two-dimensionally displays the detection signal difference to form the difference image. Alternatively, SEM images under the respective wavelength conditions may be formed and difference processing may be performed between the SEM images. A flow of acquiring the difference image is the same as the flowchart of FIG. 7 (however, the light pulse emission conditions A and B become the light pulse emission conditions having different wavelengths).

Figure 15:
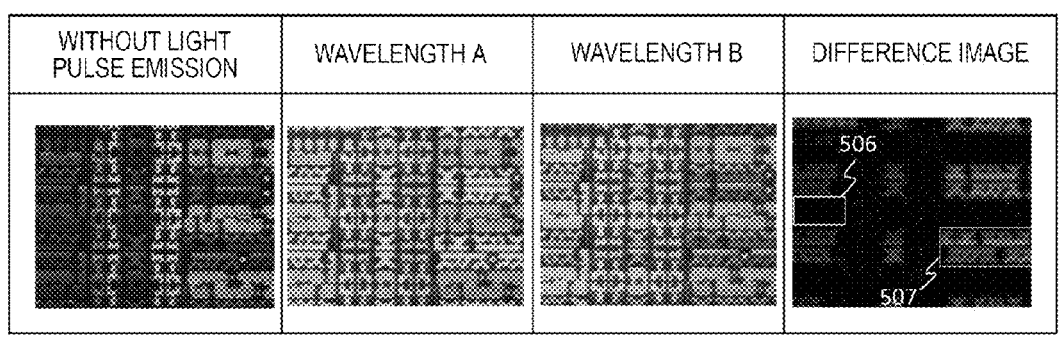
FIG. 15 is a diagram illustrating an example of an observation result according to a fifth embodiment.

The highly sensitivity defect detection inspection method of the embodiment will be described with reference to FIG. 15. The observation conditions are set as follows: the acceleration voltage of the electron beam is set to 1.5 kV, the emission current is set to 15 pA, the scanning speed is set to TV Scan, the light pulse emission intensity is set to 1000 μW, the light pulse emission interval time is set to 160 ns, and the detection sampling cycle is set to 5 ns. The light pulse emission adjustment unit 15 sets the light wavelength A and the light wavelength B, detects an amount of emitted electrons at each wavelength, and forms an image. FIG. 15 illustrates an SEM image without the light pulse emission, an SEM image with the light pulse emission of the wavelength A, an SEM image with the light pulse emission of the wavelength B, and a difference image between the SEM image with the light pulse emission of the wavelength A and the SEM image with the light pulse emission of the wavelength B. An observation location is the same. By emitting the light pulse of the wavelength A or the light pulse of the wavelength B, an emission signal of a pad portion is increased, and higher contrast can be obtained as compared with the SEM image without the light pulse emission. As a result of analyzing the difference image, a first pad 506 has the same brightness at the wavelengths A and B, and the difference image becomes dark, whereas a second pad 507 becomes bright only in the case of the wavelength A such that the difference image having high contrast can be obtained. As described above, it can be seen that even in the same sample, a signal change caused by the emission of the light pulse has wavelength dependence. It is assumed that the light pulse of the wavelength A used in the embodiment is a short wavelength light pulse and is absorbed by a material other than an oxide film, whereas the light pulse of the wavelength B is a wavelength that passes through polysilicon and an organic film, and the amount of emitted electrons changes depending on a difference in an absorption coefficient of a material. Accordingly, by appropriately selecting the emission wavelength of the light pulse, it is possible to visualize a difference in the emitted electrons based upon material information and structural information of a sample surface or a sample lower layer.

According to the embodiment, an image reflecting a value of the absorption coefficient for each wavelength can be acquired, and the contrast of the SEM image can be selectively improved by irradiating a semiconductor pattern with light having different wavelengths.

While the present invention is specifically described above based upon the embodiments, the present invention is not limited to the above-described embodiments, and various modifications can be made without departing from the spirit thereof. For example, while the first and second embodiments, and the fourth and fifth embodiments are described as being performed by the electron beam device illustrated in FIG. 1, the first and second embodiments, and the fourth and fifth embodiments can also be performed by the electron beam device illustrated in FIG. 9.

REFERENCE SIGNS LIST

1, 1': electron beam device
2: electron gun
3: deflector
4: electron lens
5: detector
6: XYZ stage
7: sample holder
8: sample
9: electron gun control unit
10: deflector control unit
11: detection control unit
12: electron lens control unit
13: pulse light source
14: light pulse control unit
15: light pulse emission adjustment unit
16: main console
17: synchronization processing unit
18: image signal processing unit
19: device control unit
20: image display unit
21: light pulse emission setting unit
22: port
23: housing
30: electron beam
31: adjustment mirror
32: flipper mirror
33: light amount variable filter
34, 35, 36: light source
41: antireflection film
42: resist
61: synchronization control unit
201: display unit
202: difference image display unit
203: observation state display unit
206: SEM image acquisition condition setting unit
302: transient analysis condition setting unit
504: time constant graph display unit

The invention claimed is:

1. An electron beam device, comprising:
an electron optical system that emits an electron beam to a sample and detects emitted electrons emitted from the sample;
a light pulse emission system that emits a light pulse to the sample;
a synchronization processing unit configured to perform detection sampling of the emitted electrons in synchronization with a deflection signal of the electron beam in the electron optical system;
an image signal processing unit configured to form an image by a detection signal outputted based upon the emitted electrons detected by the electron optical system; and
a device control unit configured to set a control condition of the electron optical system,
wherein when the time required for the electron beam to scan a region of the sample corresponding to one pixel of the image is defined as unit pixel time, the device control unit sets a sampling frequency for performing the detection sampling of the emitted electrons to be greater than a value obtained by dividing the number of emissions of the light pulse per unit pixel time by the unit pixel time.

2. The electron beam device according to claim 1,
wherein the detection signals outputted based upon the emitted electrons detected by the electron optical system are averaged for each pixel at a sampling frequency set by the device control unit, and the image is formed in the image signal processing unit.

3. The electron beam device according to claim 1, further comprising:
a light pulse emission setting unit configured to set a control condition of the light pulse emission system,
wherein the control condition of the light pulse emission system includes a wavelength, an intensity, an emission time width, and an emission interval time of the light pulse.

4. The electron beam device according to claim 3,
wherein the light pulse emission setting unit sets a first light emission condition and a second light emission condition different from the first light emission condition, and
the image signal processing unit forms a difference image between a first detection signal outputted based upon the emitted electrons detected by the electron optical system by emitting the light pulse to the sample under the first light emission condition, and a second detection signal outputted based upon the emitted electrons detected by the electron optical system by emitting the light pulse to the sample under the second light emission condition.

5. The electron beam device according to claim 4,
wherein the image signal processing unit forms the difference image based upon a difference value between the first detection signal and the second detection signal, or forms the difference image by performing difference processing between a first image formed by the first detection signal and a second image formed by the second detection signal.

6. The electron beam device according to claim 4,
wherein the sampling frequency for performing the detection sampling of the emitted electrons set by the device control unit is greater than the value obtained by dividing the number of emissions of the light pulse per unit pixel time by the unit pixel time under either the first light emission condition or the second light emission condition.

7. The electron beam device according to claim 4, further comprising:
an image display unit,
wherein the device control unit displays the difference image on the image display unit.

8. The electron beam device according to claim 4,
wherein the light pulse emission setting unit sets the first light emission condition, and the second light emission condition whose emission interval time of the light pulse is different from that of the first light emission condition.

9. The electron beam device according to claim 4,
wherein the light pulse emission setting unit sets the first light emission condition, and the second light emission condition whose wavelength of the light pulse is different from that of the first light emission condition.

10. The electron beam device according to claim 3,
wherein the light pulse emission setting unit sets a plurality of light emission conditions having different emission interval time of the light pulse, and
the device control unit obtains a time constant of the sample based upon a change in a signal amount of the detection signal outputted based upon the emitted electrons detected by the electron optical system by emitting the light pulse to the sample under the plurality of light emission conditions.

11. The electron beam device according to claim 10,
wherein the image signal processing unit forms a plurality of images by the detection signals outputted based upon the emitted electrons detected by the electron optical system by emitting the light pulse to the sample under the plurality of light emission conditions, and
the device control unit obtains the change in the signal amount of the detection signal from a change in brightness of the plurality of images.

12. An electron beam device, comprising:
an electron optical system that emits an electron beam to a sample and detects emitted electrons emitted from the sample;
a light pulse emission system that emits a light pulse to the sample;
a synchronization control unit configured to perform emission of the light pulse and detection sampling of the emitted electrons in synchronization with a deflection signal of the electron beam in the electron optical system;
an image signal processing unit configured to form an image by a detection signal outputted based upon the emitted electrons detected by the electron optical system; and
a device control unit configured to set a control condition of the electron optical system and the light pulse emission system,
wherein the device control unit sets a sampling frequency for performing the detection sampling of the emitted electrons to be equal to an emission frequency of the light pulse, and sets a plurality of interval times between an emission timing of the light pulse and a detection sampling timing of the emitted electrons, and
the image signal processing unit emits the light pulse to the sample, and forms a plurality of images by the detection signals outputted based upon the emitted electrons detected by the electron optical system at each of the plurality of interval times set by the device control unit.

13. The electron beam device according to claim 12, further comprising:
an image display unit,
wherein the device control unit displays the plurality of images on the image display unit.

14. The electron beam device according to claim 13,
wherein the image display unit displays a designation unit for designating the interval time, and displays an image in accordance with the interval time designated by the designation unit among the plurality of images.

15. The electron beam device according to claim 12,
wherein the synchronization control unit performs the detection sampling of the emitted electrons having different interval time with respect to one emission of the light pulse a plurality of times.

* * * * *